(12) United States Patent
Martinez Sanchez et al.

(10) Patent No.: US 12,384,567 B2
(45) Date of Patent: Aug. 12, 2025

(54) MODULAR PAYLOAD DEVICE FOR AN UNMANNED AIRCRAFT

(71) Applicant: AERIAL TOOLS APS, Kongens Lyngby (DK)

(72) Inventors: Pablo Miguel Martinez Sanchez, Kongens Lyngby (DK); Veronica Sobejano Paz, Kongens Lyngby (DK); Jose Ignacio Poblete Clavijo, Kongens Lyngby (DK); Panagiotis Karachalios, Kongens Lyngby (DK)

(73) Assignee: AERIAL TOOLS APS, Kongens Lyngby (DK)

( * ) Notice: Subject to any disclaimer, the term of this patent is extended or adjusted under 35 U.S.C. 154(b) by 261 days.

(21) Appl. No.: 18/267,899

(22) PCT Filed: Dec. 23, 2021

(86) PCT No.: PCT/EP2021/087555
§ 371 (c)(1),
(2) Date: Jun. 16, 2023

(87) PCT Pub. No.: WO2022/136665
PCT Pub. Date: Jun. 30, 2022

(65) Prior Publication Data
US 2024/0059434 A1  Feb. 22, 2024

(30) Foreign Application Priority Data
Dec. 24, 2020 (ES) .................. U202032786

(51) Int. Cl.
*B64U 20/80* (2023.01)
*B64U 101/60* (2023.01)
*H05K 7/14* (2006.01)

(52) U.S. Cl.
CPC .......... *B64U 20/80* (2023.01); *H05K 7/1412* (2013.01); *B64U 2101/60* (2023.01)

(58) Field of Classification Search
CPC .. B64C 39/024; B64U 20/80; B64U 2101/60; H01K 7/1412
(Continued)

(56) References Cited

U.S. PATENT DOCUMENTS 4,771,971 A * 9/1988 Ludwig .................. B64G 1/641
244/173.1
5,912,799 A * 6/1999 Grouell ................ G11B 33/126
(Continued)

FOREIGN PATENT DOCUMENTS

| EP | 4268550 B1 * | 11/2024 | ............. B64U 20/80 |
| WO | WO-2019028071 A1 * | 2/2019 | ............. B64C 1/061 |
| WO | WO-2022136665 A1 * | 6/2022 | ............. B64U 20/80 |

*Primary Examiner* — Jennifer E. Novosad
(74) *Attorney, Agent, or Firm* — Schwabe, Williamson & Wyatt, P.C.

(57) ABSTRACT

A modular payload device for an unmanned aircraft provided with a body made up of a plurality of guides, rods, frames provided with guiding recesses, coupling elements, and longitudinal members linked to a printed circuit board (PCB) formed by connectors and power regulators for connecting flight and payload instruments, wherein the frames are fixed to the body by means of introducing the rods through perforations made on the frames, whereas the coupling elements and the anchoring means are linked with the complementary anchoring means by tongue and groove clipping. Advantageously, the electric circuit of the PCB allows the integration and synchronization of sensors for remote sensing.

14 Claims, 9 Drawing Sheets

(58) Field of Classification Search
USPC ........ 211/84, 191, 192; 224/401; 244/118.1; 361/679.01, 759; 410/82, 91
See application file for complete search history.

(56) References Cited

U.S. PATENT DOCUMENTS

| | | | | |
|---|---|---|---|---|
| 6,308,728 | B1 * | 10/2001 | Frazier | G01M 3/04 |
| | | | | 211/184 |
| 6,482,541 | B1 * | 11/2002 | Bator, Jr. | H01M 50/224 |
| | | | | 429/96 |
| 6,719,150 | B2 * | 4/2004 | Marraffa | H01M 50/264 |
| | | | | 211/49.1 |
| 7,547,487 | B1 * | 6/2009 | Smith | H01M 50/553 |
| | | | | 429/57 |
| 7,548,429 | B2 * | 6/2009 | Miller | H01M 10/627 |
| | | | | 429/96 |
| 7,740,142 | B2 * | 6/2010 | Miller | H01M 50/296 |
| | | | | 211/26 |
| 9,105,970 | B1 * | 8/2015 | Heinrich | H01Q 5/22 |
| 9,371,038 | B2 * | 6/2016 | Gregory, Jr. | B60R 7/02 |
| 9,756,765 | B1 * | 9/2017 | Michaud | H05K 7/1488 |
| 10,793,247 | B2 | 10/2020 | Fan | |
| 10,994,842 | B1 * | 5/2021 | Skylus | B64C 37/02 |
| 11,673,505 | B2 * | 6/2023 | Axline | B60P 7/0807 |
| | | | | 244/118.1 |
| 2004/0079714 | A1 * | 4/2004 | Andrew | H01M 50/209 |
| | | | | 211/49.1 |
| 2013/0175993 | A1 * | 7/2013 | Chen | H02J 7/0044 |
| | | | | 320/114 |
| 2014/0042199 | A1 | 2/2014 | Gregory, Jr. | |
| 2015/0156385 | A1 * | 6/2015 | Wang | F16M 11/18 |
| | | | | 244/118.1 |
| 2016/0129998 | A1 | 5/2016 | Welsh et al. | |
| 2016/0176537 | A1 * | 6/2016 | Rodriguez | H05K 7/18 |
| | | | | 224/401 |
| 2018/0297701 | A1 | 10/2018 | Dunkelberger et al. | |
| 2019/0135403 | A1 | 5/2019 | Perry et al. | |
| 2024/0059434 | A1 * | 2/2024 | Martinez Sanchez | |
| | | | | H05K 7/1412 |

* cited by examiner

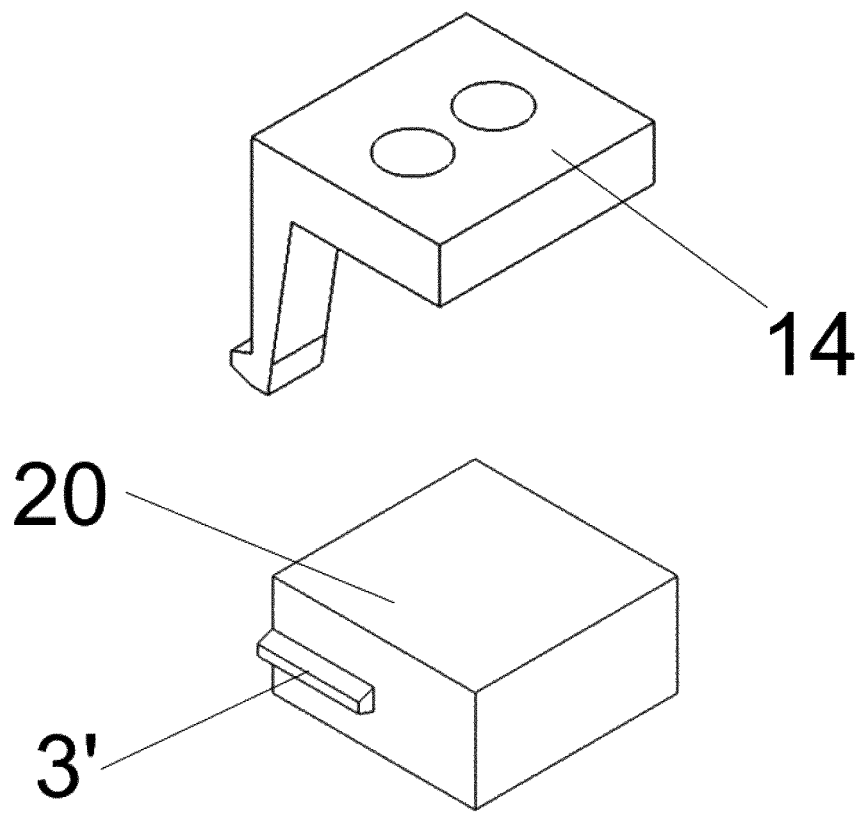
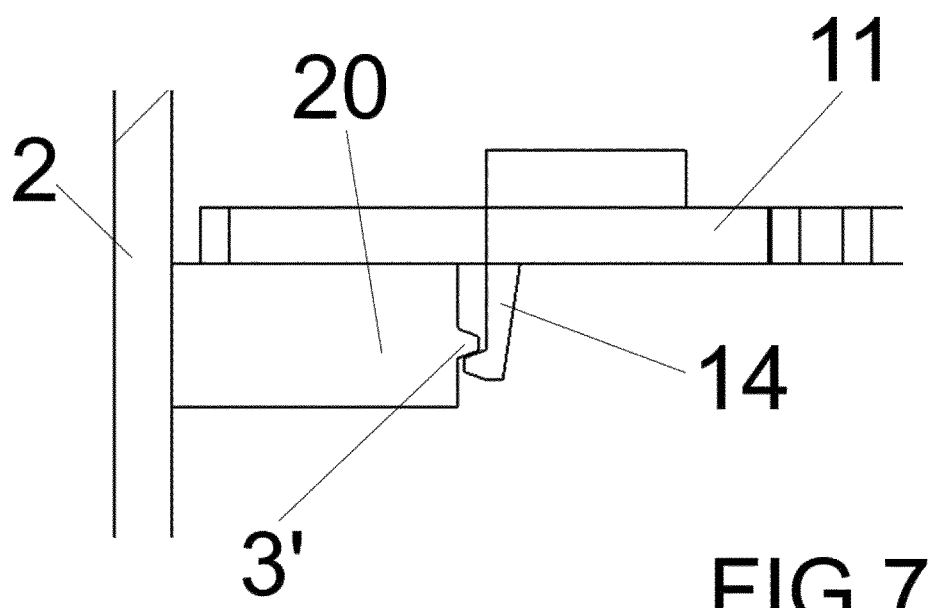

MODULAR PAYLOAD DEVICE FOR AN UNMANNED AIRCRAFT

CROSS-REFERENCE TO RELATED APPLICATIONS

The present application is a national phase entry under 35 U.S.C. § 371 of International Application No. PCT/EP2021/087555, filed Dec. 23, 2021, which designates the United States of America, which claims priority to ES Application No. U202032786, filed Dec. 24, 2020, the entire disclosures of each of these applications are hereby incorporated by reference in their entireties and for all purposes.

OBJECT OF THE INVENTION

The present invention relates to a modular payload device which is preferably intended for the connection thereof with unmanned aircrafts and is modular in nature with several possible final configurations to allow the coupling of more than one component and to thereby facilitate the exchange, synchronization, and display of data incorporated in an unmanned aerial system.

BACKGROUND OF THE INVENTION

Unmanned aircrafts which facilitate countless day-to-day operations are extremely well known and widely used. In fact, devices of this type are highly versatile, which allows the inclusion of various accessories that allow expanding their functionalities.

Nevertheless, the applicant of the present utility model observes that devices known in this sector do not allow freedom in terms of the integration of sensors for remote sensing with unmanned aircrafts.

In fact, most known unmanned aircrafts only allow the connection of one external payload device or a payload device with the capacity for a single sensor, which significantly limits the functions thereof.

All of the above has led the applicant of the present utility model to detect the need to develop a payload device which incorporates improvements to allow the inclusion of more than one sensor and accessories depending on the required needs.

DESCRIPTION OF THE INVENTION

The modular payload device of the present invention is made up of an electromechanical assembly of components which allows an easy data exchange, synchronization, and display for sensors for remote sensing incorporated in an unmanned aerial system which is known internationally as UAS (Unmanned Aircraft System) or also as RPAS (Remotely Piloted Aircraft System) and referred to hereinafter as an unmanned aircraft.

In this sense, the modular payload device for an unmanned aircraft proposed by the present invention is provided with a body and a printed circuit board PCB. The body is thereby formed by the following elements:

At least two longitudinal members, wherein each longitudinal member is provided with at least one coupling element.
At least four guides, wherein each guide has attachment means through which it is coupled to the longitudinal members.
Four rods, such that one end of the rod rests on a base which is provided with anchoring means.
At least two frames provided with a plurality of perforations and guiding recesses, wherein the guiding recesses allow coupling the frame to the guide.
A plurality of complementary coupling elements attached to the frames.

The PCB, which is linked to one of the longitudinal members, has a plurality of standardized connectors and a plurality of power regulators for connecting flight instruments and payload instruments of the unmanned aircraft.

Moreover, the frames are fixed to the body by means of introducing the rods through the perforations of the frames. Likewise, the coupling means of the vertical longitudinal members and the anchoring means of the base are linked with the complementary anchoring means by tongue and groove clipping.

The main advantage provided by the device of the invention lies in that fact that its mechanical components ensure a quick and simple connection of instruments, while the electric circuit of the PCB allows the integration and synchronization of sensors for remote sensing or other elements such as an on-board computer, a positioning and localization system (GPS/GNSS), or a touch screen. Likewise, the developed device is modular in nature, offering complete development and connection freedom with respect to the on-board computer present in an unmanned aircraft.

According to the nature of the sensors incorporated in the modular device of the invention, it will therefore be possible to collect data for mapping, inspection, or improving the air navigation of the unmanned aircraft.

The modular device incorporates a printed circuit board (PCB) which will be connected to the sensors, an on-board computer, and a flight controller present in the unmanned aircraft.

In a practical assembly of the modular payload device on the aircraft, a battery powers the PCB which acts as a power source integrating system and enables connection between the sensors arranged in the modular payload device and the printed circuit of the unmanned aircraft. The printed circuit of the unmanned aircraft is formed by a flight controller, an on-board computer, and a screen. The flight controller is controlled by the on-board computer. The sensors connected to the PCB can therefore be used for changing flight functions of the unmanned aircraft.

Lastly, it should be pointed out that the developed modular payload device allows the time required for adapting its structural configuration to each project to be reduced, whereby the task can be performed in a matter of hours instead of days or months.

BRIEF DESCRIPTION OF THE DRAWINGS

To complete the description that will be made below and for the purpose of helping to better understand the features of the invention, a set of drawings is attached as an integral part of said description in which the following is depicted in an illustrative and non-limiting manner:

FIG. 6 shows a view of a coupling element and a complementary coupling element that collaborate with one another in the preferred embodiment of the modular payload device for an unmanned aircraft object of the invention.

FIG. 7 shows a section view depicting the way in which a coupling element and a complementary coupling element, depicted in FIG. 6, are attached to one another.

PREFERRED EMBODIMENT OF THE INVENTION

Figure 1:
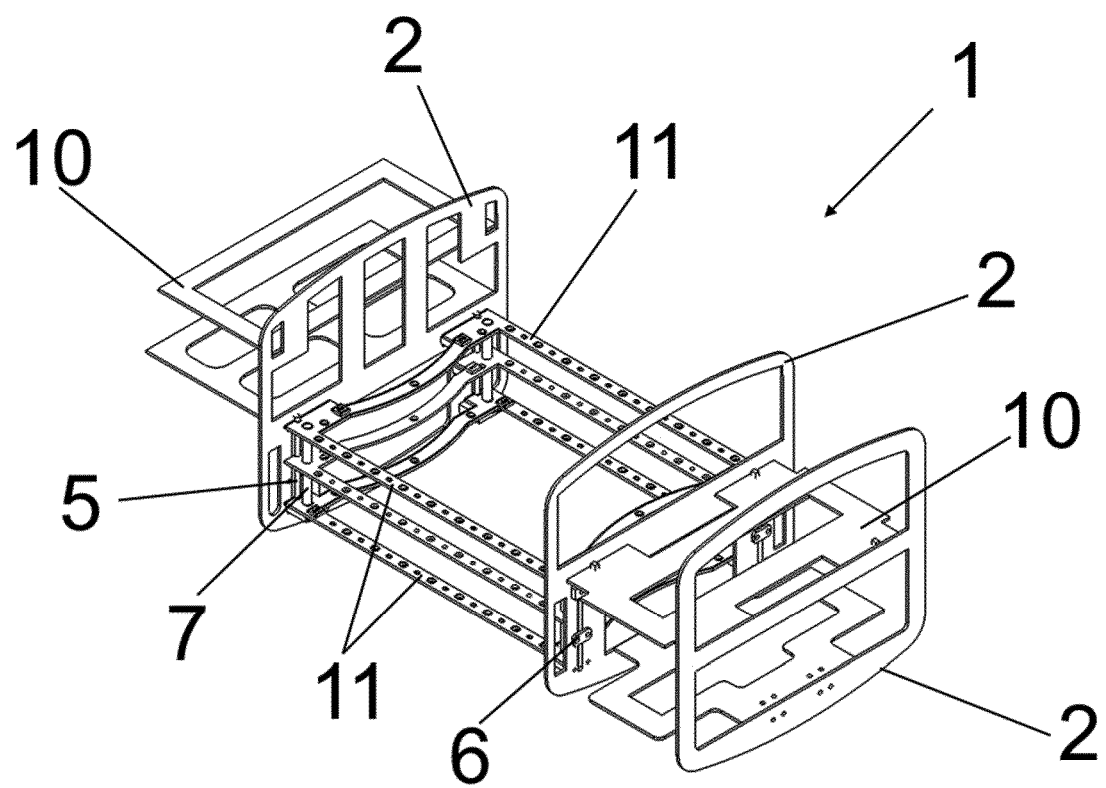
FIG. 1 shows a perspective view of the modular payload device for an unmanned aircraft according to a preferred embodiment of the invention.
Figure 2:
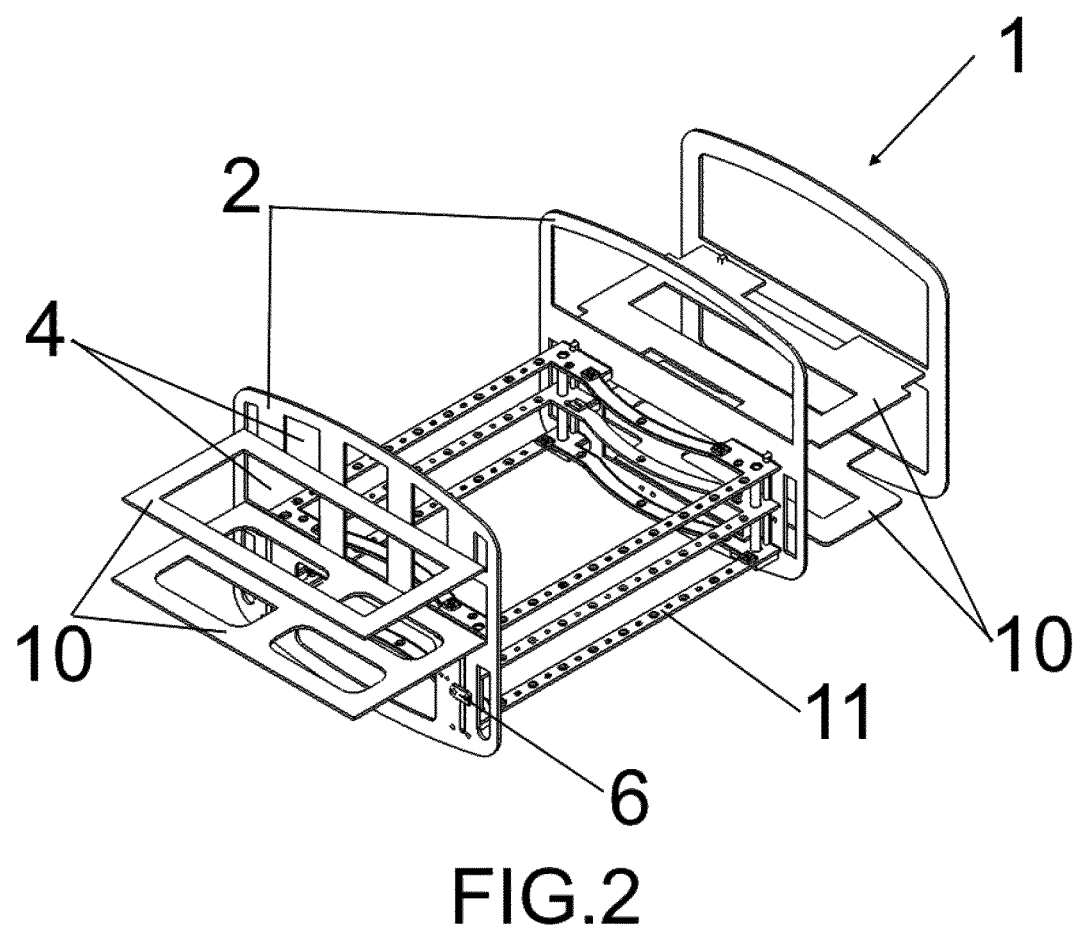
FIG. 2 shows a perspective view of the preferred embodiment of the invention seen from an angle opposite that of the preceding figure.
Figure 3:
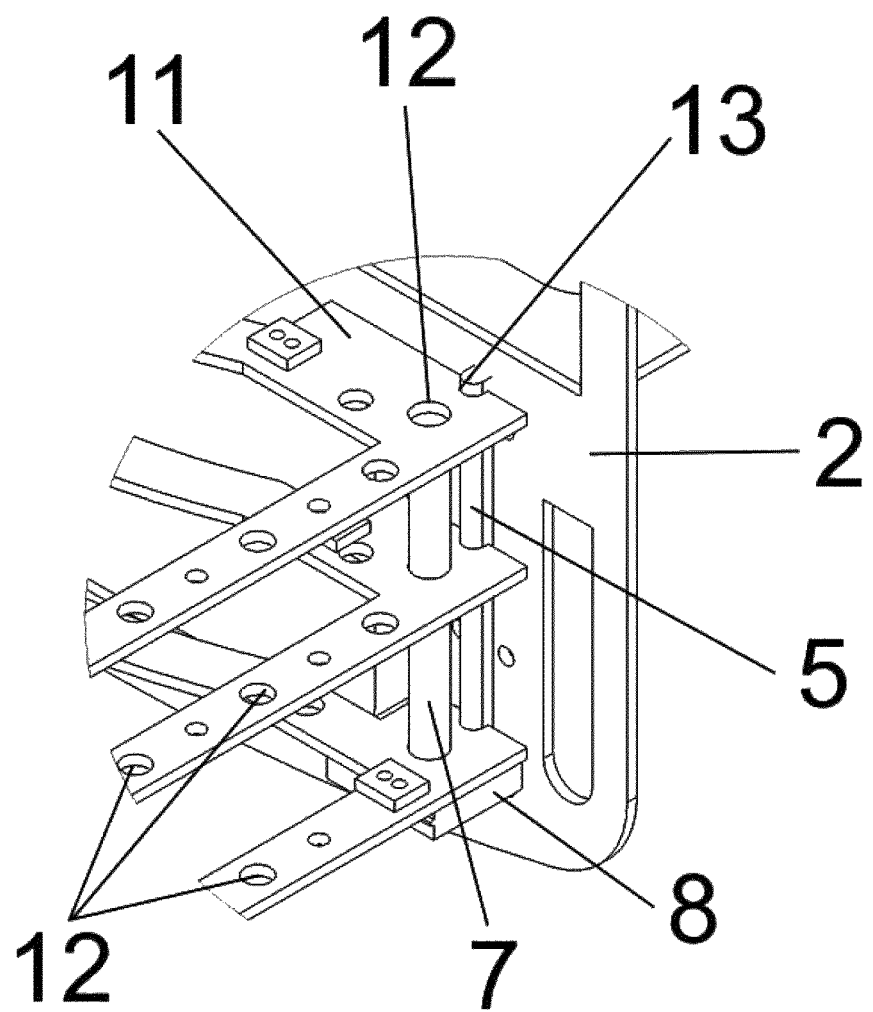
FIG. 3 shows a detailed view of the body and the linkage thereof to the frames and tray making up the preferred embodiment of the modular payload device for an unmanned aircraft.
Figure 4:
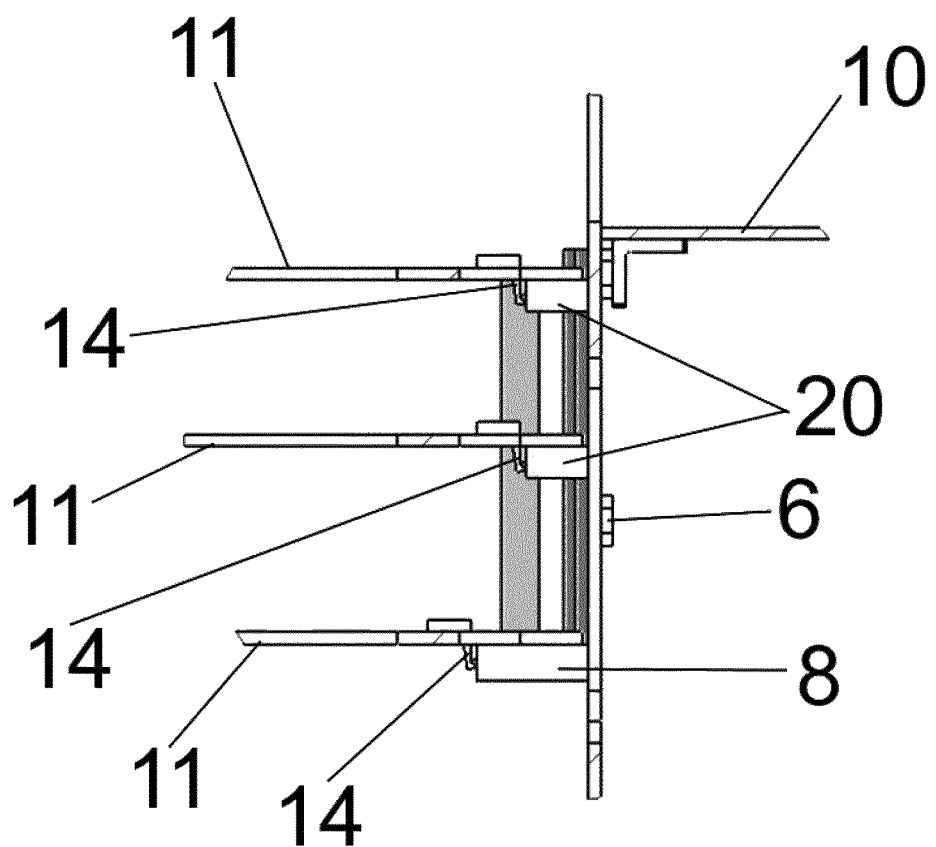
FIG. 4 shows a detail of a section view of the body and the linkage thereof to the frames and to a tray according to the depiction of FIG. 3.

In view of the mentioned figures, specifically FIGS. 1, 2, and 3, it can be observed that in a preferred embodiment of the invention the modular payload device is made up of a body (1) preferably formed by:

Three longitudinal members (2), wherein two of the longitudinal members (2) are provided with four coupling elements (20), two of which can be seen in FIG. 4.

Four guides (5), wherein each guide (5) has attachment means (6) through which it is coupled to the longitudinal members (2).

Figure 5:
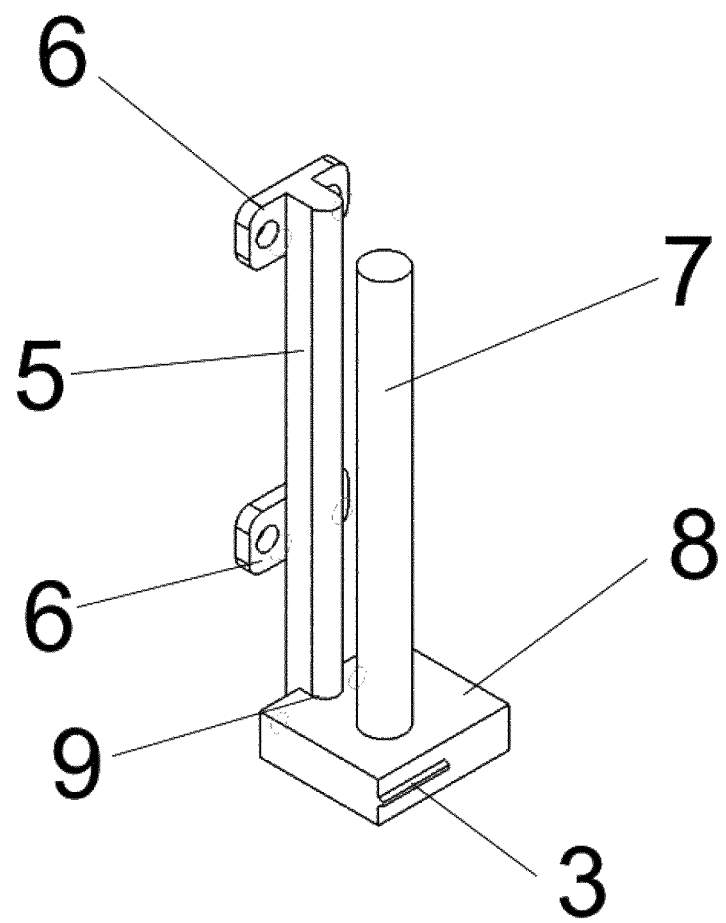
FIG. 5 shows a view of a rod, a base, and the attachment means making up the preferred embodiment of the modular payload device for an unmanned aircraft object of the invention.

Four rods (7) such that one end of the rod (7) rests on a base (8) which is provided with anchoring means (3), as can be seen in FIG. 5.

Three frames (11) provided with a plurality of perforations (12) and guiding recesses (13). Advantageously, the guiding recesses (13) allow coupling the frame (11) to the guide (5), as can be seen in FIG. 3, so the frames (11) are fixed to the body (1) by means of introducing the rods (7) through the perforations (12) of the frames (11).

A plurality of complementary coupling elements (14) attached to the frames (11), preferably by screwing.

As can be seen in FIGS. 4, 6, and 7, the anchoring means (3') of the coupling elements (20) of the longitudinal members (2) and the anchoring means (3) of the base (8) are linked with the complementary anchoring means (14) by tongue and groove clipping. Preferably, the longitudinal members (2) are manufactured from polymer matrix composite due to its high mechanical strength relative to weight.

Likewise, the modular payload device is provided with a printed circuit board (PCB) (15) linked to one of the longitudinal members (2), wherein the PCB has a plurality of standardized connectors and a plurality of power regulators for connecting flight instruments and payload instruments of the unmanned aircraft. Preferably, the standardized connectors are at least a USB connector, an Ethernet connector, a UART connector, and an I2C connector.

As can be seen in FIG. 5, the anchoring means (3) of the base (8) are preferably configured by a rigid fastener element. On the other hand, each coupling element (20) of the longitudinal members (2) is provided with a rigid fastener element (3'), as can be seen in FIGS. 6 and 7. Each complementary coupling element (14) is thereby preferably made up of a flexible fastener element. Therefore, as depicted in FIG. 4, the rigid fastener element (3') of the coupling element (20) facilitates attachment with the flexible fastener element of the complementary coupling element (14) by clipping, generating a linkage between the central and upper frames (11) and the longitudinal members (2). Similarly, the anchoring means (3) of the base (8) are attached to the complementary coupling element (14) by clipping, generating a linkage between the lower frame (11) and the longitudinal members (2).

The modularity of the developed device is achieved through the multiple options for arranging the frames (11) in height offered by the body (1). To that end, the base (8) has a notch (9) for coupling the guide (5); in a complementary manner, the guide (5) includes attachment means (6) which are coupled to the longitudinal member (2) and one end of the rod (7) rests on the base (8). A structure which has a plurality of frames (11) at different heights and attached to the longitudinal members (2) is thereby configured, such that it is possible to introduce the frames (11) on the rods (7) through the perforations (12) thereof and to fix said frames by means of the coupling elements (20).

Figure 12:
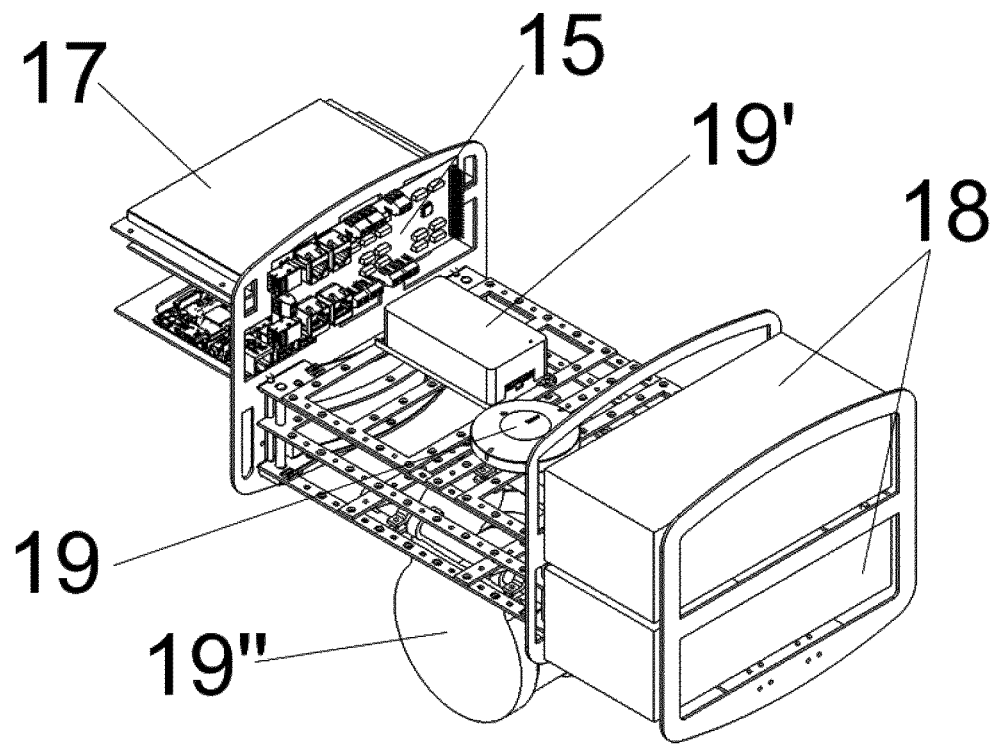
FIG. 12 shows a perspective view of the modular payload device for an unmanned aircraft according to a preferred embodiment of the invention including a touch screen, a battery, GPS, IMU, LiDAR, and a PCB.

FIG. 12 shows that the modular payload device can include trays (10) associated with the longitudinal members (2) of the body (1), defining a space in which there are incorporated elements such as: a touch screen (17) for displaying the data collected by the sensors of the unmanned aircraft and for checking the operation of the systems on board the unmanned aircraft during flight campaigns, one or two batteries (18) for powering the modular device, an alarm for indicating the level of the battery (18), and/or an on-board computer. Specifically, it should be indicated that the inclusion of the on-board computer will be very useful if the unmanned aircraft linked to the modular payload device of the invention does not have an on-board computer.

Likewise, FIG. 2 shows that the longitudinal members (2) and the trays (10) are provided with openings (4) which help to reduce the weight of the longitudinal member. Additionally, the opening (4) of the longitudinal members (2) allows for an area for anchoring elements, such as for example, the PCB (15), as can be seen in FIG. 12.

Figure 8:
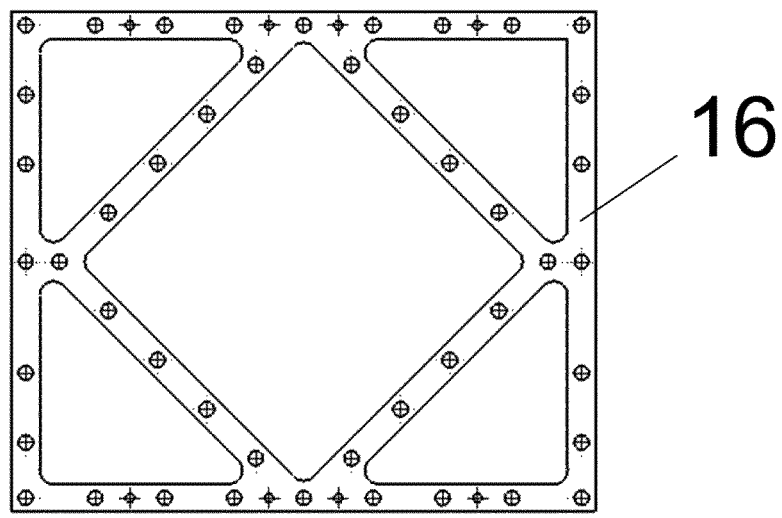
FIG. 8 shows a depiction of a first auxiliary element which can be screwed to the frame of the modular payload device for an unmanned aircraft object of the invention.
Figure 9:
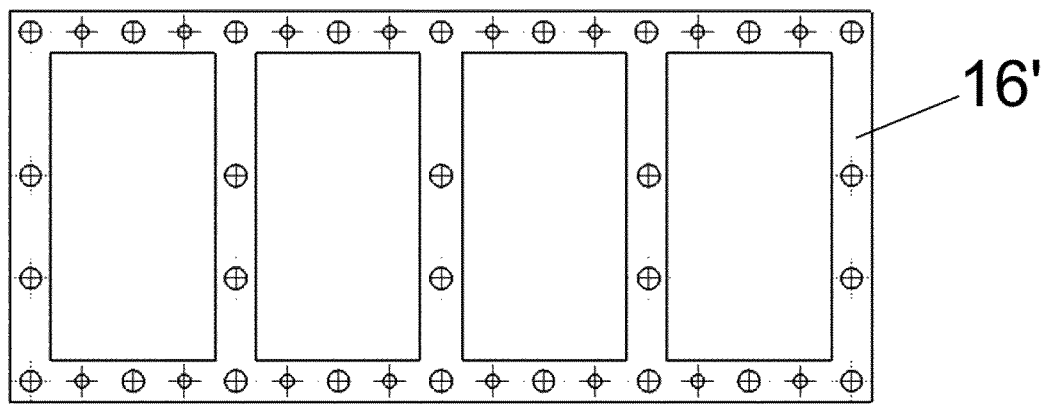
FIG. 9 shows a depiction of a second auxiliary element which can be screwed to the frame of the modular payload device for an unmanned aircraft object of the invention.
Figure 10:
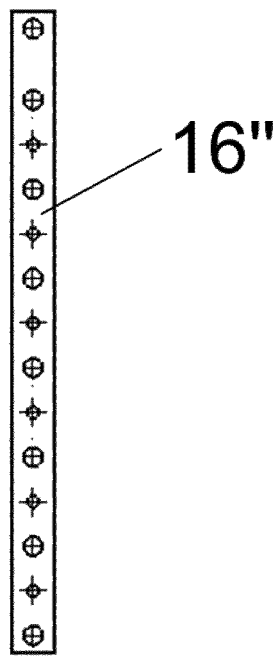
FIG. 10 shows a depiction of a third auxiliary element which can be screwed to the frame of the modular payload device for an unmanned aircraft object of the invention.

Moreover, it should be pointed out that auxiliary elements (16), (16'), (16"), such as those depicted in FIGS. 8, 9, and 10, respectively, can be screwed onto the perforations (12) of the frames (11), said elements having different configurations for offering different surface constructions on the frames (11) depending on the elements to be incorporated thereon.

The auxiliary elements (16), (16'), (16") added to the body (1) are used for coupling payload instruments at the different levels or heights as described in detail above. The auxiliary elements (16), (16'), (16") provide the capacity to distribute the payload and add structural reinforcements if the load so requires.

For example, said auxiliary elements allow incorporating additional components such as: a GPS (19), an IMU (19'), and a LiDAR (19"), as can be seen in FIG. 12. IMU (19') is an electronic device referred to as inertial measurement unit which measures and provides information about the speed, orientation, and gravitational forces of the unmanned aircraft. The inclusion of LiDAR (19") (Light Detection and Ranging or Laser Imaging Detection and Ranging) will allow the distance from that element, as a laser emitter, to an object or surface to be determined using a pulsed laser beam.

Figure 11:
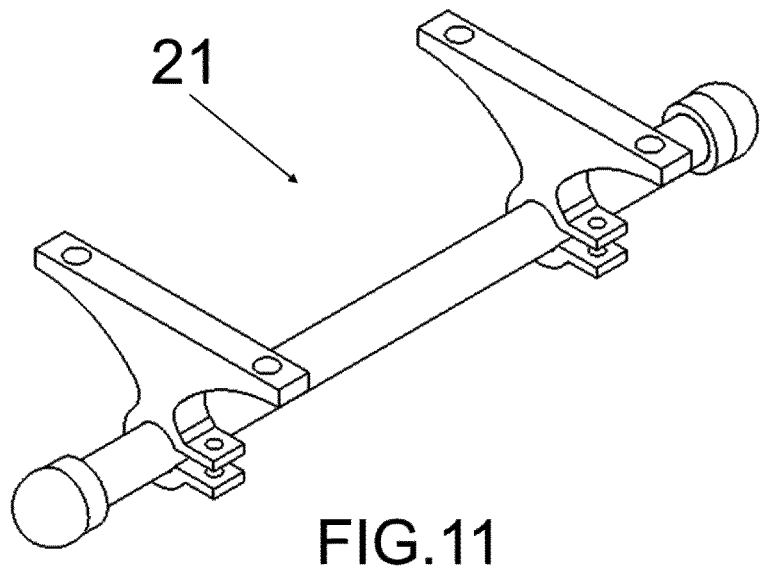
FIG. 11 shows a depiction of an auxiliary suspension element which can be coupled to the modular payload device for an unmanned aircraft object of the invention.

Likewise, FIG. 11 depicts an auxiliary suspension element (21) which can also be linked to the perforations of the frames (11) to enable the suspension of, for example, a LiDAR (19"), as can be seen in FIG. 12.

Figure 13:
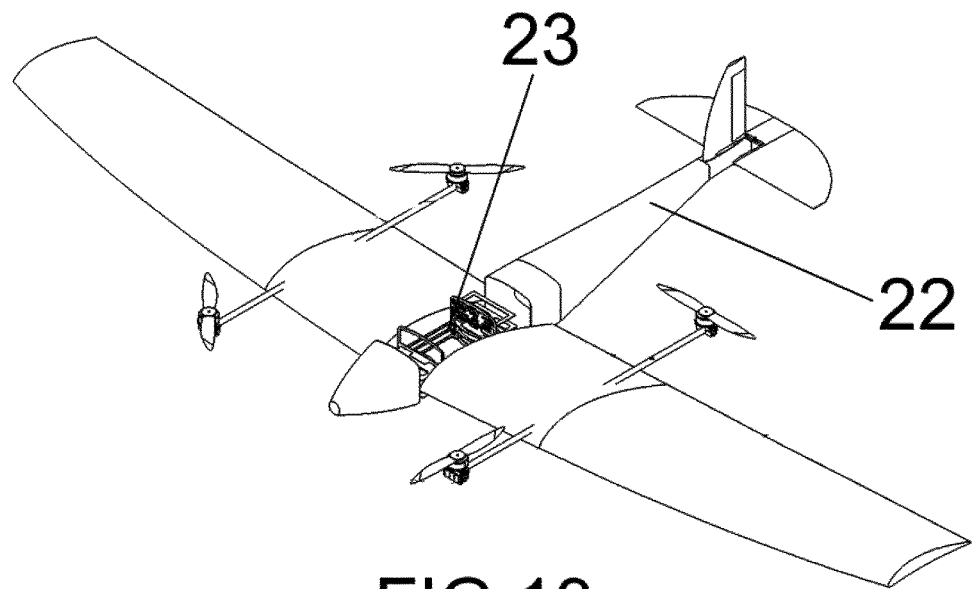
FIG. 13 shows a depiction of an unmanned aircraft including a modular payload device according to the object of the present invention.

Based on the foregoing, the developed modular payload device is characterized by being a useful tool. As can be seen in FIG. 13, the modular payload device (23) is designed to be mounted in an unmanned aircraft (22), preferably in hybrid aircrafts referred to as VTOL (vertical take-off and landing), as depicted in FIG. 13, although it can also be mounted in fixed-wing aircrafts.

The modular payload device is preferably located in the center of the fuselage of the unmanned aircraft (23) around the center of gravity, so as not to affect air navigation during pitching with load variation.

The invention claimed is:

1. A modular payload device for unmanned aircraft, characterized in that it is provided with
   a body (1) made up of:
      at least two longitudinal members (2), wherein each longitudinal member (2) is provided with at least one coupling element (20),
      at least four guides (5), wherein each guide (5) has attachment means (6) through which it is coupled to the longitudinal members (2),
      four rods (7) such that one end of the rod (7) rests on a base (8) which is provided with anchoring means (3),
      at least two frames (11) provided with a plurality of perforations (12) and guiding recesses (13), wherein the guiding recesses (13) allow coupling the frame (11) to the guide (5),
   a plurality of complementary coupling elements (14) attached to the frames (11),
   and a printed circuit board (PCB) (15) linked to one of the longitudinal members (2), which has a plurality of standardized connectors and a plurality of power regulators for connecting flight instruments and payload instruments of the unmanned aircraft,
   wherein the frames (11) are fixed to the body (1) by means of introducing the rods (7) through the perforations (12) of the frames (11), whereas the coupling elements (20) of the longitudinal members (2) and the anchoring means (3) of the base (8) are linked with the complementary anchoring means (14) by tongue and groove clipping.

2. The modular payload device for unmanned aircrafts according to claim 1, characterized in that the coupling element (20) is provided with a rigid fastener element (3').

3. The modular payload device for unmanned aircrafts according to claim 1, characterized in that the anchoring means (3) of the base (8) are configured by a rigid fastener element.

4. The modular payload device for unmanned aircrafts according to claim 1, characterized in that each complementary coupling element (14) is made up of a flexible fastener element.

5. The modular payload device for unmanned aircrafts according to claim 1, characterized in that the complementary coupling elements (14) are attached to the frames (11) by screwing.

6. The modular payload device for unmanned aircrafts according to claim 1, characterized in that the longitudinal members (2) are provided with openings (4).

7. The modular payload device for unmanned aircrafts according to claim 1, characterized in that the base (8) has a notch (9) for the coupling of the guide (5).

8. The modular payload device for unmanned aircrafts according to claim 1, characterized in that auxiliary elements (16), (16'), (16") are screwed onto the perforations (12) of the frames (11).

9. The modular payload device for unmanned aircrafts according to claim 1, characterized in that it has trays (10) linked to the longitudinal members (2).

10. The modular payload device for unmanned aircrafts according to claim 1, characterized in that the standardized connectors are at least a USB connector, an Ethernet connector, a UART connector, and an I2C connector.

11. The modular payload device for unmanned aircrafts according to claim 1, characterized in that it has a touch screen (17).

12. The modular payload device for unmanned aircrafts according to claim 1, characterized in that it has at least one battery (18).

13. The modular payload device for unmanned aircrafts according to claim 1, characterized in that it has an on-board computer.

14. The modular payload device for unmanned aircrafts according to claim 1, characterized in that it has an alarm.

* * * * *